(12) United States Patent  
Pan et al.

(10) Patent No.: US 9,296,023 B2  
(45) Date of Patent: Mar. 29, 2016

(54) AIR-BLOWN CLEANING SYSTEM FOR PHOTOMASKS AND METHOD THEREOF

(71) Applicant: GUDENG PRECISION INDUSTRIAL CO, LTD., New Taipei (TW)

(72) Inventors: Yung-Chin Pan, New Taipei (TW); Tsung-Yi Yang, Nantou County (TW); Liang-Wei Lai, Taoyuan County (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 660 days.

(21) Appl. No.: 13/762,541

(22) Filed: Feb. 8, 2013

(65) Prior Publication Data

US 2014/0150824 A1   Jun. 5, 2014

(30) Foreign Application Priority Data

Dec. 3, 2012   (TW) .............................. 101145299 A

(51) Int. Cl.
*G06K 9/00* (2006.01)
*B08B 5/02* (2006.01)
*B08B 13/00* (2006.01)
*G03F 1/82* (2012.01)
*B08B 5/04* (2006.01)

(52) U.S. Cl.
CPC . *B08B 5/02* (2013.01); *B08B 13/00* (2013.01); *G03F 1/82* (2013.01)

(58) Field of Classification Search
USPC .................. 382/100, 103, 106, 108, 140–141, 382/144–149, 162, 168, 173, 181, 193, 199, 382/209, 219, 232, 254, 274–276, 283–291, 382/305, 312, 321; 430/5, 311; 134/1, 99.1, 134/18, 21
See application file for complete search history.

(56) References Cited

U.S. PATENT DOCUMENTS

| | | | |
|---|---|---|---|
| 2006/0019178 A1* | 1/2006 | Lee | G03F 1/82 430/5 |
| 2008/0115806 A1* | 5/2008 | Yu | B08B 3/04 134/18 |
| 2009/0065024 A1* | 3/2009 | LeClaire | B08B 7/0042 134/1 |
| 2010/0151391 A1* | 6/2010 | Neogi | B82Y 10/00 430/311 |
| 2013/0186436 A1* | 7/2013 | Jeong | G03F 1/82 134/99.1 |

FOREIGN PATENT DOCUMENTS

TW   M432924   7/2012

* cited by examiner

*Primary Examiner* — Seyed Azarian

(74) *Attorney, Agent, or Firm* — Li & Cai Intellectual Property (USA) Office

(57) ABSTRACT

An air-blown cleaning system for cleaning a photomask includes an image capturing module, an identification and control module, and an air knife device. The image capturing module captures an image of the photomask and divided the image into a plurality of sections for the identification and control module to identify particular sections with contaminants for subsequent cleaning and to store such data into a database. The air knife device includes at least one air knife module which receives data from the database and controls the air knife module to air blow the particular sections with contaminants. The instant disclosure also includes a method of air blow cleaning for cleaning a photomask.

10 Claims, 2 Drawing Sheets

AIR-BLOWN CLEANING SYSTEM FOR PHOTOMASKS AND METHOD THEREOF

BACKGROUND OF THE INVENTION

1. Field of the Invention

The instant disclosure relates to an air-blown cleaning system for photomasks and a method thereof; in particular, to an air-blown cleaning system and a method for cleaning photomasks employed during the production of semiconductors.

2. Description of Related Art

During the production of semiconductors, the cleaning process is of high importance, in particular, the cleaning process for removing contaminants (organic substances, pollutants, chemical residue, etc.) on photomasks are essential for optimizing product quality and yield. If photomasks are not effectively and thoroughly cleaned, contaminants can significantly impact production capacity and yield.

In common semiconductor or photomask production, components usually undergo multiple wetting processes and subsequent processes which repeatedly interchange. During the interchanges, dopants or moisture tends to reside on the semiconductors or photomasks. In addition, dust and other contaminants are commonly generated during moving and storing. Contaminants such as dusts, dopants, and moisture must be thoroughly removed in order to prevent any effects on subsequent production processes. As a result, each step of photomasks cleaning must be performed with care and caution to minimize financial impact.

Furthermore, the most important factor in wafer yield depends on the cleanliness of photomasks. When particles are present on photomasks, wafers which are made with contaminated photomasks generally exhibit corresponding defects, thus making photomasks cleaning fairly important.

Concerning the conventional semiconductor cleaning system, a Taiwan patent number TW M432924, "an air knife device and module" provided by the inventor includes a plurality of ventilation tubing for increasing outlet pressure. With a plurality of air knife device and module, a relatively big surface area is purged through airflow thereby further saves cleaning time on semiconductor photomasks.

Based on the energy saving trends, the instant disclosure further improves energy savings and allowing operators to thoroughly remove contaminants to ensure cleanliness.

To address the above issues, the inventor strives via associated experience and research to present the instant disclosure, which can effectively improve the limitation described above.

SUMMARY OF THE INVENTION

The instant disclosure provides an air-blown cleaning system for cleaning photomasks and a method thereof particularly aim to effectively clean sections on the photomasks by concentrated air blowing on sections which are contaminated, and provide an examination interface which allows operators to examine and ensure the cleanliness by comparing photomasks before and after cleaning.

Particularly, the system includes an image capturing module for capturing an image of the photomask and dividing the image into a plurality of sections, an identification and control module for identifying the sections with contaminants on a photomask and storing such data to a database, and an air knife device including at least one air knife module for receiving data from database and controlling the air knife module to air blow the sections with contaminants on photomask according to data from database. In addition, the method includes capturing the image of the photomask, dividing the image of the photomask into the plurality of sections, examining each section for contaminants, recording the sections with contaminants for storing to the database; and mobilizing then air knife device according to data from database for air blowing the sections with contaminants.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

Figure 1:
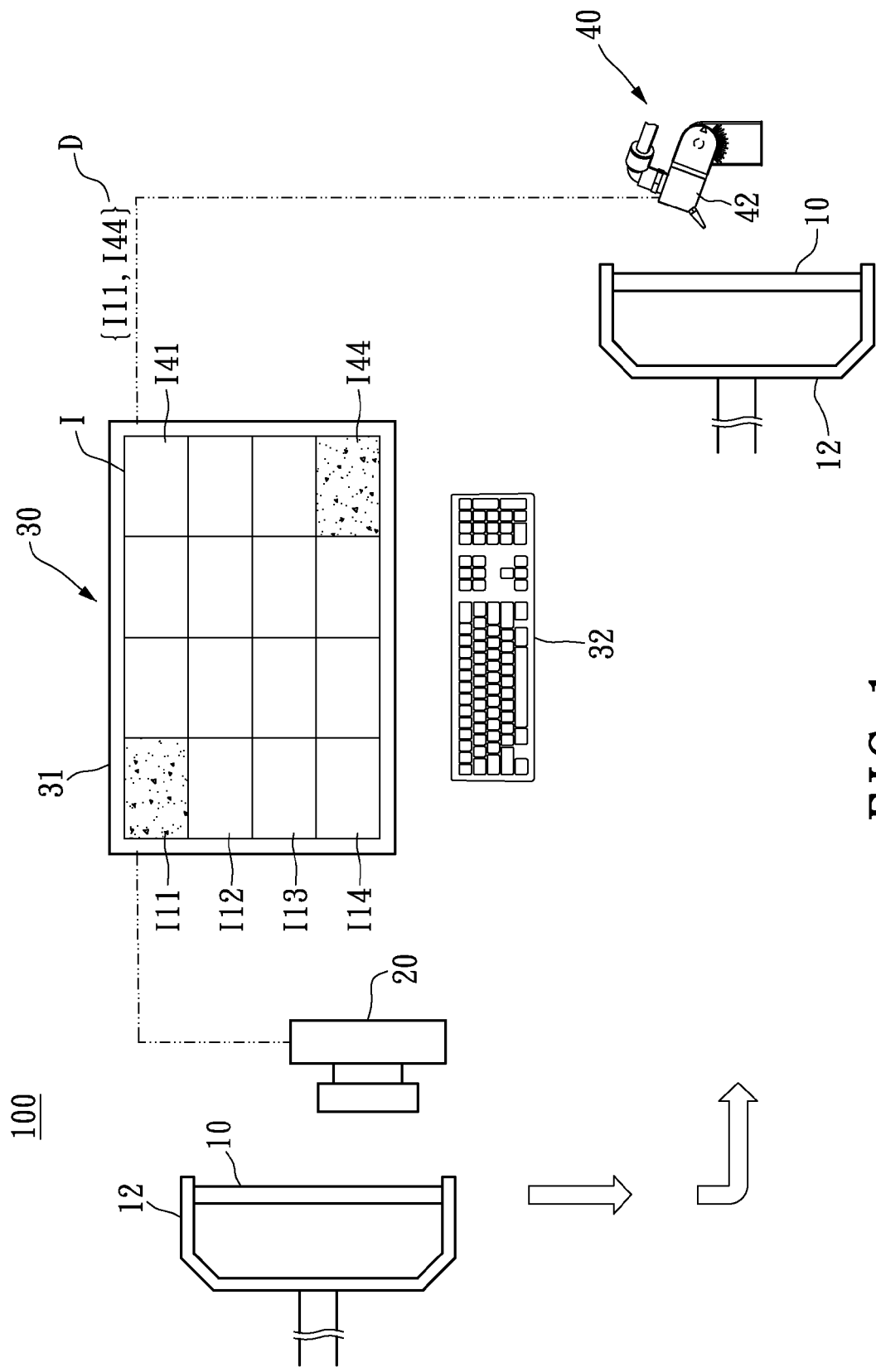
FIG. 1 is a schematic diagram illustrating the air-blown cleaning system for photomasks of the instant disclosure.

As illustrated in FIG. 1, a schematic diagram of an air-blown cleaning system 100 for photomasks is disclosed. Specifically, in the preferred embodiment, a photomask 10 is cleaned by the air-blown cleaning system 100 which includes an image capturing module 20, an identification and control module 30, and an air knife device 40. The image capturing module 20 captures an image of the photomask 10 and divides the image into a plurality of sections S (a 4×4 grid arrangement) while the identification and control module 30 identifies the sections S needed to be cleaned or with contaminants on the photomask 10 and stores such data to a database D. The air knife device 40 includes at least one air knife module 42, receives data from the database D, and controls the air knife module 42 to air blow the sections S with contaminants on the photomask 10 according to data stored to database D.

Figure 2:
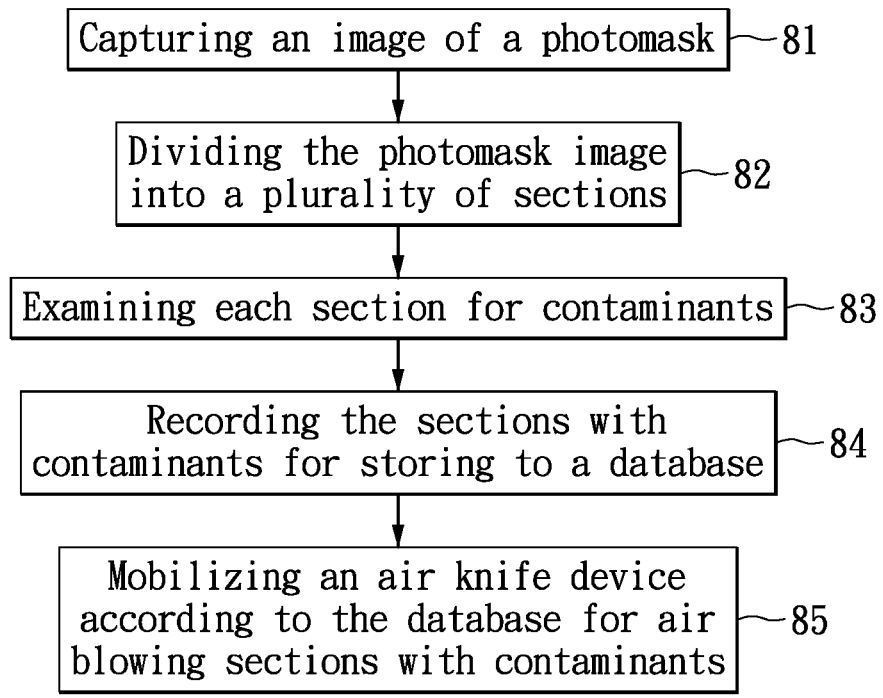
FIG. 2 is a flow chart illustrating the air-blown cleaning method for photomasks of the instant disclosure.

Furthermore, a flow chart in FIG. 2 illustrates the method of the instant disclosure. The steps illustrated in FIG. 2 are executed by a non-transitory computer medium. Initially, as shown in step 81 of FIG. 2, the image of the photomask 10 is captured via the image capturing module 20. The image of the photomask 10 can be captured as a whole or by divided sections for images with finer details compared to the whole. Next, as shown in step 82 of FIG. 2, the image of the photomask 10 is divided into the plurality of sections S or the already divided images can be examined.

Since photomask patterns are very delicate, the image capturing module 20 of the instant embodiment preferably can be a microphotography unit for capturing a plurality of micro images as shown in an example in FIG. 1, 16 sections S I11, I12, I13, I14 to I41, I44, etc. In order words, the image of a whole photomask 10 can be divided into plurality of sections and micro images of each section can be taken thereafter. The quantity of sections is determined as needed and is not limited to the example of the instant embodiment provided therein. Subsequently, an image integration module integrates the plurality of micro images into an integrated photomask image I.

Preferably, the photomask 10 is mobilized to an image capturing area for image capturing and a blowing area for cleaning so as to prevent interference by particles during cleaning with image capturing of photomask 10. The photomask 10 can be displaced to different operation areas on a machine via a mobilizing device 12 such as displacing the photomask 10 proximate to the image capturing module 20 or the air knife device 40. The mobilizing device 12 in the drawings are only exemplary, more details can be retrieved through the related art, Taiwan patent number 1317149, the retaining device of "Photomasks cleaning device".

Next, as shown in step 83 of FIG. 2, each section is examined for contaminants to be cleaned mainly through the identification and control module 30 which includes a display unit 31 for displaying the integrated photomask image I as an examination interface for an operator. The identification and control module 30 also includes a control unit 32 which marks the sections with contaminants, for example, sections I11 and I44 as shown in FIG. 1. The control unit 32 can be an input keyboard or a touch sensitive display unit 31 to provide a touch controlled interface for the operator. The steps for marking photomasks 10 during examination can be mainly executed by automated-identification or artificial identification as a supplemental identification process. Automated-identification is preferred in the instant embodiment. However, visual inspection by operators can also be applied as deemed necessary to examine if photomasks 10 cleaning is complete. Visual inspections ensure the cleanliness of photomasks 10 when operators identify sections S with contaminants and marked the contaminated sections S with the control unit 32 for further cleaning. In the aforementioned example, touch screen is preferred for display unit 32. The divided sections S of the photomask 10 can be selectively chosen and magnified by operators through the integrated photomask image I shown on the display unit 31, so the sections S which need cleaning are selectively marked and the data are recorded to the database D as shown in FIG. 2.

Referring back to the automated-identification, another example of the identification and control unit 30 can also be a visual identification unit for identifying sections with contaminants which are larger than a predetermined set of tolerable dimensions on the photomask 10. The visual identification unit can be an image comparison software to facilitate visual comparisons in which the examination step includes predetermining a set of tolerable dimensions for cleaning contaminants (such as particles). The predetermined set of tolerable dimensions are preset by operators based on the desired level of cleanliness, for example, a set of predetermined dimensions can be larger than 10 microns to 0.01 microns in width, but the tolerance is not limited to the range in this example. If large particles are present, coordinates of the large particles are recorded and output along with corresponding data relating to sections S to database D as shown in FIG. 2.

Successively, the air knife device 40 is mobilized to air blow the sections with contaminants according to data from database D. In addition, air blowing can be applied to photomasks prior to the image capturing process via a plurality of air knives arranged in an array for preliminary cleaning, and then followed by supplementary cleaning, thereby reducing cleaning duration.

Through the air-blown cleaning system for cleaning photomasks and method thereof, sections on the photomasks are effectively cleaned by concentrated air blowing particularly on sections which are contaminated, and operators are provided with the examination interface which allows operators to examine and ensure the cleanliness by comparing photomasks before and after cleaning.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. An air-blown cleaning system implemented by a processor for cleaning a photomask, comprising:
    an image capturing module for capturing an image of the photomask and dividing the image into a plurality of sections;
    an identification and control module for identifying the sections with contaminants on the photomask and storing to a database; and
    an air knife device including at least one air knife module, receiving data from the database, and controlled the air knife module to air blow the sections with contaminants on the photomask according to the database;
    wherein the image capturing module includes a microphotography unit for capturing a plurality of micro-images of the plurality of sections on the photomask; and an image integration module for integrating the plurality of micro-images taken from the plurality of sections into an integrated photomask image.

2. The system as recited in claim 1, wherein the identification and control module includes a display unit for displaying the integrated photomask image for operators to examine.

3. The system as recited in claim 2, wherein the identification and control module further includes a control unit for marking sections with contaminants.

4. The system as recited in claim 1, wherein the identification and control module further includes a visual identification unit for identifying sections on the photomask with contaminants outside a predetermined set of tolerable dimensions of the photomask, recording a plurality of coordinates of contaminants, and outputting the coordinates and the corresponding sections with contaminants to database.

5. The system as recited in claim 1, wherein the system further comprises: a mobilizing device for mobilizing the photomask proximate to the image capturing module and the air knife device.

6. An air-blown cleaning method for cleaning a photomask, comprising a non-transitory computer readable medium, which executes the following instructions:
    capturing an image of a photomask;
    dividing the image of the photomask into a plurality of sections;
    examining each section for contaminants;
    recording the sections with contaminants for storing to a database; and
    mobilizing an air knife device according to the database for air blown the sections with contaminants;
    wherein the step of capturing an image of the photomask includes capturing a plurality of micro-images of the sections on the photomask via microphotography, and integrating the plurality of micro-images of the sections on the photomask into an integrated photomask image.

7. The method as recited in claim 6 further comprising the step of: providing a display unit for displaying and identifying the integrated photomask image to an operator for examination.

8. The method as recited in claim 6, wherein the step examining each section with contaminants includes a predetermined set of tolerable dimensions for contaminants on the photomask.

9. The method as recited in claim 8 further comprising the step of: providing a visual identification unit for identifying sections of the photomask with contaminants outside of the predetermined set of tolerable dimensions of the photomask, recording a plurality of coordinates with contaminants, and outputting the coordinates and the corresponding sections to the database.

10. The method as recited in claim 6 further comprising the step of: mobilizing the photomask proximate to the image capturing module and the air knife device.

\* \* \* \* \*